United States Patent [19]

Chen

[11] 4,152,679

[45] May 1, 1979

[54] MICROMINIATURE ELECTRICAL DELAY LINE UTILIZING THIN FILM INDUCTOR ARRAY WITH MAGNETIC ENHANCEMENT AND COUPLING

[75] Inventor: Stephen T. C. Chen, Villanova, Pa.

[73] Assignee: Hull Corporation, Hatboro, Pa.

[21] Appl. No.: 851,490

[22] Filed: Nov. 14, 1977

[51] Int. Cl.² .................. H03H 7/30; H03H 7/18; H01F 27/30; H01F 27/24
[52] U.S. Cl. ........................... 333/150; 333/23; 333/204
[58] Field of Search .............. 333/29, 70 S, 23, 31 R, 333/70 R; 336/200, 205, 232, 180, 177, 217, 69; 29/602

[56] References Cited

U.S. PATENT DOCUMENTS

| | | |
|---|---|---|
| 2,847,648 | 8/1958 | Wendolkowski et al. ............ 333/29 |
| 3,436,687 | 4/1969 | Andrews, Jr. et al. ............... 333/29 |
| 3,585,535 | 6/1971 | Senf ....................................... 333/29 |
| 3,634,785 | 1/1972 | Kameya ................................. 333/29 |
| 3,785,046 | 1/1974 | Jennings .............................. 29/602 |
| 3,798,059 | 3/1974 | Astle et al. ...................... 336/200 X |

Primary Examiner—Alfred E. Smith
Assistant Examiner—Marvin Nussbaum
Attorney, Agent, or Firm—Oliver D. Olson

[57] ABSTRACT

A microminiature electrical delay line utilizes an m-derived filter formed by depositing a film of permalloy or other high permeability metal on a quartz or other dielectric substrate, then depositing a layer of quartz or other dielectric over the permalloy film, after which a plurality of microminiature thin film inductance coils are deposited on the dielectric layer and joined together electrically in series, a top layer of quartz or other dielectric then is deposited over the interconnected coils and a strip of permalloy or other high permeability metal is deposited over the top dielectric layer to extend across the coils, a gap being provided in the strip of permalloy at the central axis of each coil.

4 Claims, 15 Drawing Figures

MICROMINIATURE ELECTRICAL DELAY LINE UTILIZING THIN FILM INDUCTOR ARRAY WITH MAGNETIC ENHANCEMENT AND COUPLING

BACKGROUND OF THE INVENTION

This invention relates to electrical delay lines, and more particularly to a delay line in microminiature form suitable for hybrid circuit application.

There are available in the market place many electrical delay lines in the form of standard dual-in-line integrated circuit packages. However, there is not available a delay line in chip form suitable for hybrid circuit applications.

SUMMARY OF THE INVENTION

In its basic concept, this invention provides an electrical delay line in which at least one pair of series-connected, microminiature, inductance coils is interposed between films of dielectrical material which, in turn, are interposed between films of permalloy or other high permeabilty metal, one of the latter films forming a strip which extends across the inductance coils and is interrupted at each coil to form a gap at the central axis of each coil.

It is by virtue of the foregoing basic concept that the principal objective of this invention is achieved; namely, to provide a microminiature electrical delay line suitable for hybrid circuit applications.

Another objective of this invention is the provision of a delay line of the class described which is of simplified construction for economical manufacture.

The foregoing and other objects and advantages of this invention will appear from the following detailed description, taken in connection with the accompanying drawing of a preferred embodiment.

DESCRIPTION OF THE PREFERRED EMBODIMENT

Figure 4:
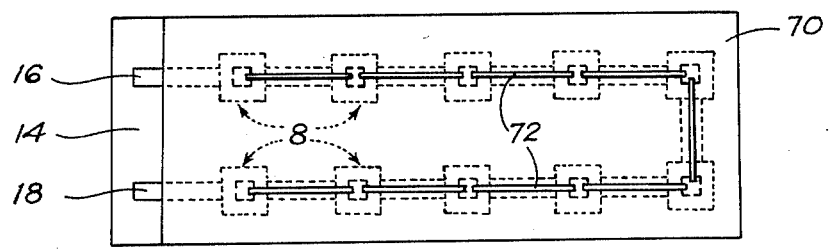
FIG. 4 is a plan view of a delay line in chip form, embodying the features of this invention.
Figure 5:
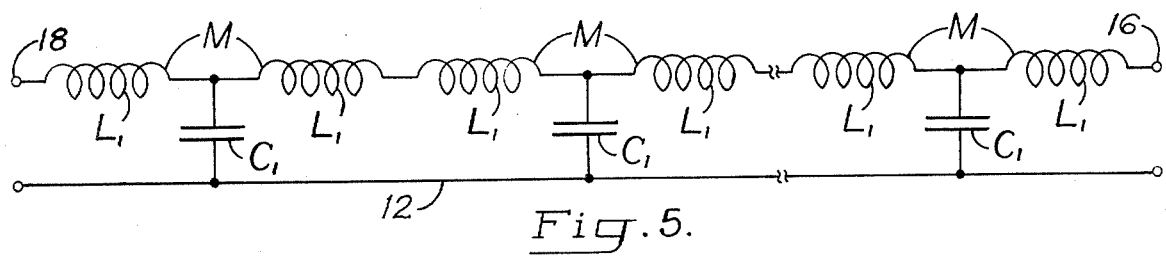
FIG. 5 is a schematic diagram of an indeterminate number of sections of an m-derived filter utilized for the delay line of this invention.
Figure 6:
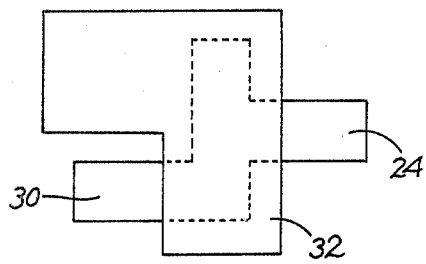
FIGS. 6-15 are plan views showing, in diagrammatic form, the preferred sequential steps in the formation of the inductance coil shown in FIG. 3.

As illustrated in FIG. 5, the delay line of this invention utilizes an m-derived filter a section of which includes a pair of series-connected inductance coils 8 (FIGS. 1-4) each providing an inductance $L_1$ and having mutual inductance M between them, and a shunting capacitance $C_1$. The delay line may include any number of such sections as desired, limited only by the attenuation or loss that can be tolerated.

In accordance with this invention, the delay line is constructed and supported upon a substrate 10 of quartz, glass or other dielectric material, preferably suitable for the thin film deposition of the delay line components as described hereinafter. For purposes of this invention, thin film deposition is understood to include depositions by printed circuit techniques as well as vapor deposition techniques. Preferred among these is the vapor deposition method described in U.S. Pat. No. 3,785,046. By this technique the various films are applied by means of masks which delineate the shapes of areas upon which the vapors depositions of conductive metal and dielectric material are to be made.

As illustrated, a film 12 of permalloy, mu-metal, or other suitable high permeability metal, is deposited upon and bonded integrally to one entire surface of the substrate 10. This film serves as a return path of the magnetic circuit and also as the ground plane for the delay line capacitances. A suitable thickness for this film is approximately 5,000 Angstroms.

Deposited upon and bonded integrally to the entire area of film 12 of high permeability metal is a film 14 of silicon oxide, silicon nitrite, quartz, or other suitable dielectric material. As discussed hereinafter, the thickness of this film may be varied.

Next, a pair of electrically conductive terminals 16 and 18 are deposited upon the dielectric film 14, adjacent one side of the substrate, for use in connecting the delay line to associated hybrid circuits. If desired, these terminals may be extended to the back side of the substrate 10 to accommmodate the mounting of hybrid circuitry on said back side. The high permeability metal ground plane 12 serves effectively to isolate the hybrid circuitry from the delay line.

Next, at least one pair of microminiature inductance coils 8 is mounted upon and bonded integrally to the dielectric layer 14. As illustrated in FIG. 4, ten such inductance coils are spaced apart on the substrate in two rows.

Figure 1:
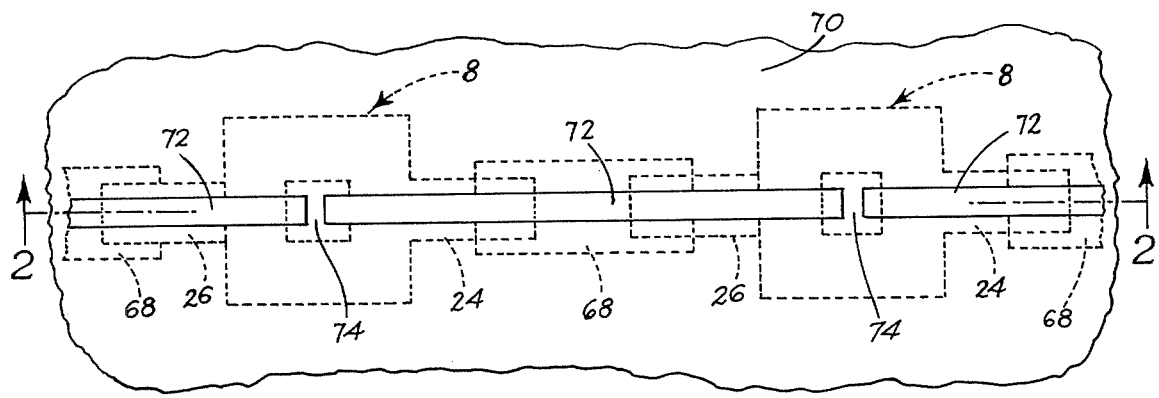
FIG. 1 is a fragmentary plan view, on an enlarged scale, of an electrical delay line embodying the features of this invention.
Figure 2:
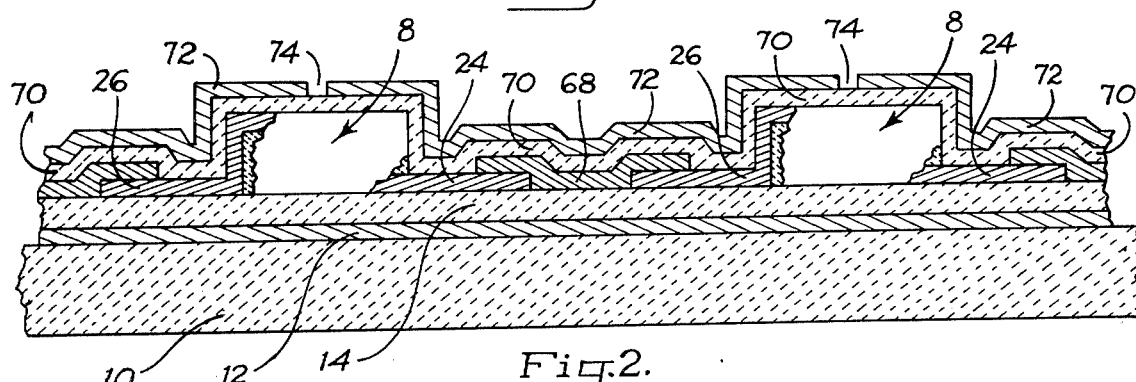
FIG. 2 is a fragmentary sectional view taken on the line 2—2 in FIG. 1.
Figure 3:
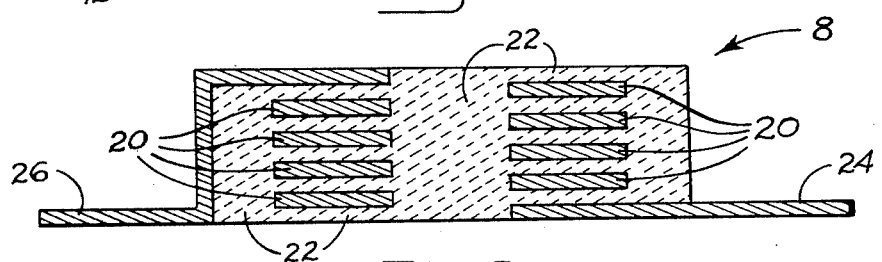
FIG. 3 is a sectional view showing on an enlarged scale a preferred construction of an inductance coil forming a part of the delay line.

In FIG. 3, each coil is shown to include a plurality of superimposed coaxial turns 20 of electrically conductive metal film with adjacent turns isolated electrically from each other by an interposed film 22 of dielectric material. The innermost and outermost turns are extended laterally in opposite directions to provide end terminals 24 and 26.

All of the inductance coils 8 forming the delay line, ten of them as exemplified in FIG. 4, are formed simultaneously, but spaced apart in the desired pattern, by appropriately constructed masks. FIGS. 6-15 illustrate diagrammatically the sequential steps utilized in the formation of the inductance coil illustrated in FIG. 3. Thus, a first mask is utilized to provide the vapor deposition of the initial electrically conductive coil turn segment 30. In the illustrated embodiment, this segment includes the laterally projecting end terminal 24 a portion of which overlies a portion of one of the end terminals 16 and 18, for example terminal 18.

Figure 7:
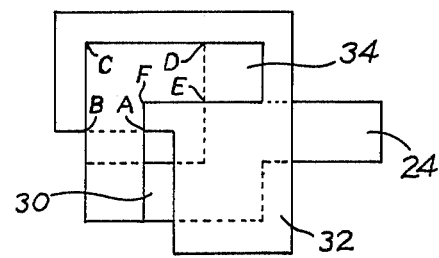
Figure 8:
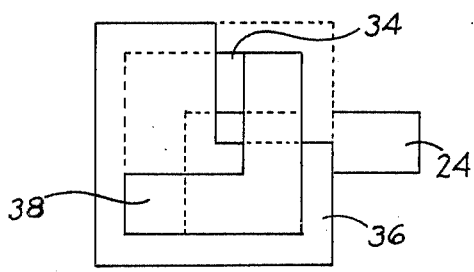
Figure 9:
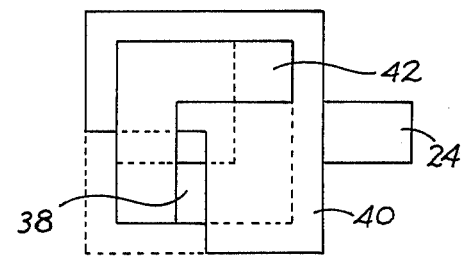
Figure 10:
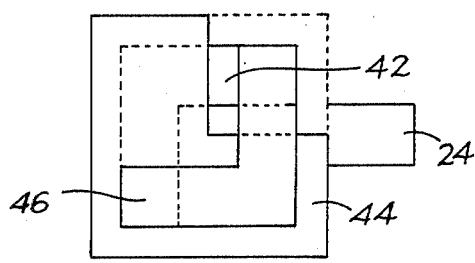
Figure 11:
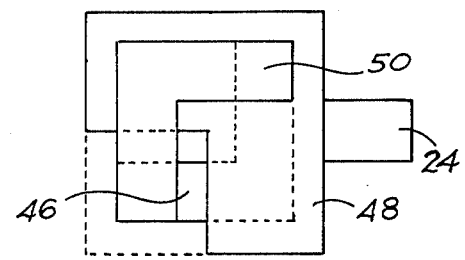
Figure 12:
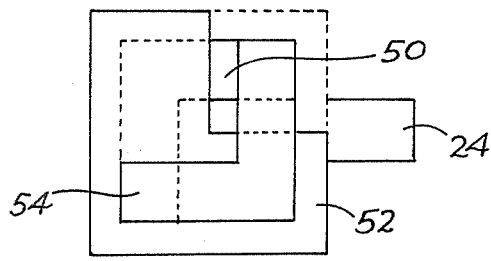
Figure 13:
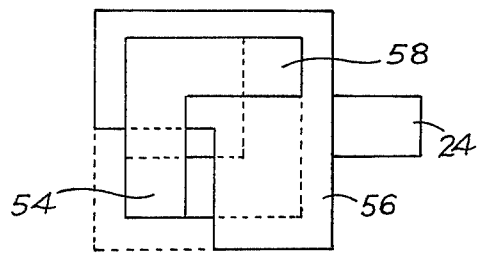
Figure 14:
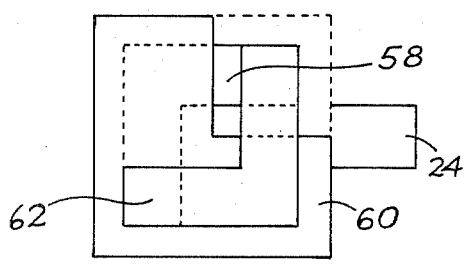

Next, by appropriate masking, a film of quartz or other suitable dielectric material 32 is vapor deposited over an intermediate portion of the segment 30 (FIG. 6), leaving a leading end portion of the segment exposed for conductive connection of a trailing end portion of the next conductive turn segment 34 (FIG. 7). This latter segment overlies the dielectric film 32.

Next, a second deposition of dielectric film 36 (FIG. 8) is applied over the trailing portion of the conductive segment 34. The mask providing this deposition is substantially identical to the mask providing the first dielectric deposition 32, with the pattern rotated 180° so as to expose the leading end portion of the underlying conductive segment 34 for conductive connection to the trailing end portion of the next succeeding conductive segment 38. The shape of this latter segment is substantially identical to the shape of the next preceding conductive segment 34, but rotated 180°, as will be apparent.

Subsequent dielectric films 40, 44, 48, 52, 56, 60 and 64 and conductive segments 42, 46, 50, 54, 58 and 62 are deposited alternately (FIG. 9–14), utilizing the masks which provided the depositions of the dielectric films and conductive film segments described hereinbefore, to complete the desired number of turns for each inductance coil 8. In the embodiment illustrated in FIGS. 6–15, the sequence provides for the deposition of four and one-half turns of conductive metal, with each turn separated electrically from each other by an interposed film of dielectric material.

Figure 15:
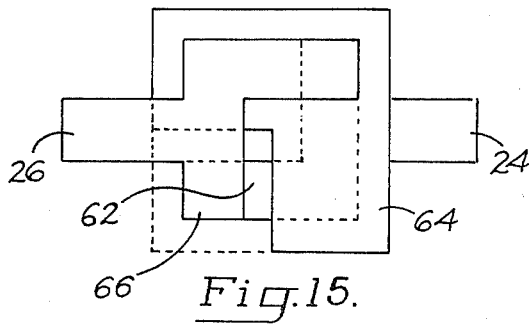

The coil is completed with the addition of the final conductive turn segment 66 and integrated end terminal 26 opposite the starting end terminal 24. As indicated in FIG. 15, this is achieved by utilizing a mask having an aperture shaped like that of the mask which provided the first turn segment 30 and connected end terminal 24, but rotated 180°.

It will be understood, of course, that in the production of the delay line illustrated in FIG. 4, wherein ten spaced inductance coils are provided, the masks referred to in describing the sequence illustrated in FIGS. 6–15, contain shaped openings necessary for the simultaneous depositions required for the production of the ten inductance coils.

The end terminal 26 on the final inductance coil 8, opposite the initial coil, is deposited in overlapping, conductive engagement with the second of the pair of terminals 16 and 18, for example terminal 16, initially deposited on the dielectric film 14, as will be understood.

The confronting end terminals 24, 26 of adjacent coils 8 are interconnected electrically by means of a link 68 of electrically conductive metal film such as aluminum, gold, or other suitable metal. The plurality of coils thus are connected together electrically in series.

Next, a second film 70 of silicon oxide, quartz, or other suitable dielectric material, is deposited over the series-connected inductance coils 8, as well as the interconnecting links 68 and the adjacent first film 14 of dielectric material. This film 70 terminates short of the end terminals 16 and 18, as illustrated in FIG. 4.

Finally, an elongated strip 72 of permalloy, or other high permeability metal, is deposited as a film, also suitably about 5,000 Angstroms thick, over the second layer 70 of dielectric material, extending along the centerline of the series-connected coils 8. This narrow strip of high permeability metal is interrupted at each coil to form a gap 74 at the axis of each coil. In this latter regard, it is to be noted that the coil turns are stacked one upon another concentrically about a central axis which is disposed perpendicularly to the supporting surface of the substrate 10.

The strip 72 of permalloy or other high permeability metal which extends between centers of adjacent inductance coil cooperates with the film 12 of high permeability metal underlying the coils to provide the mutual inductance M required. The desired value of mutual inductance is obtained by varying the width of the strip 72 and the length of the gaps 74 at the centers of the coils. The thickness of the dielectric layers 14 and 70 also affects the mutual inductance.

The capacitance $C_1$ per section of the delay line is provided by the capacitance between the high permeability metal ground plane 12 and the underside of the inductance coil, including the area of the end terminals 24 and 26 and the link 68 interconnecting the confronting end terminals of a pair of adjacent inductance coils. This capacitance may be varied by changing the thickness of the dielectric layer 14 above the ground plane and the area of the conductive link 68.

The following illustrates a typical delay line: Let it be assumed that the inductance, $L_1$ of the filter is 45 nh. For an m-derived filter having a characteristic impedance, $Z_o$, the relationships among $L_1$, $C_1$, and $Z_o$ are as follows:

$$Z_o = \sqrt{L/C}; L_1 = 0.515 L; C_1 = 1.26 C; \text{ and } M = 0.234 L.$$

wherein L and C are the inductance and capacitance, respectively, per section of a constant K filter. If we assume a value of $Z_o$ of 100 ohms, then $C_1 = 1.27(L/Z_o2) = 11.1$ pf.

When more than one section of the filter is connected in series to obtain the delay time required, every inductance coil 8 except the ones at each end of the series network will have the inductance value of $2L_1$. Therefore, all the inductance coils except the two end ones should have an inductance of 90 nh. and the two end ones have an inductance of 45 nh each.

As previously mentioned, the magnetic strip 72 and the film 12 of permalloy or other high permeability metal provide mutual coupling between two adjacent coils. They also enhance the self-inductance of each coil. By choosing the appropriate width of magnetic strip 12 and the length of gap 74, the mutual inductance and self-inductance can be varied independently. Therefore, for ease of fabrication it is possible to have the same of number of turns for all the coils. By varying the degree of magnetic enhancement the end coils can have half ($L_1$) the inductance of the others ($2L_1$). This is easily accomplished because of the fact that the end coils have only one magentic strip 72 linking them instead of two for the other coils.

Let it also be assumed that the width of the links 68 are the same as the end terminals 24 and 26. They are shown narrower in FIG. 1 merely for clarity. The total area $A_1$ of the coil, end terminals and link directly over the dielectric layer 14 of silicon oxide is 1,180 mil$^2$, or $7.61 \times 10^{-3}$ cm.$^2$, and the area $A_2$ of the portion of the second half turn 34 that overlies the dielectric layer 14 but not the first half turn 30 (FIG. 7) is identified as area ABCDEF and is 150 mil$^2$, or $0.967 \times 10^{-3}$ cm.$^2$. Thus, the required capacitance per section is $$C_1 = 0.08842K \left( \frac{A_1}{d_1} + \frac{A_2}{d_1 + d_2} \right) = 11.1 \; pf.$$

wherein K is the dielectric constant of silicon oxide, assumed to be a value of 6; $d_1$ is the thickness of the silicon oxide layer 14 above ground plane 12, and $d_2$ is the thickness of $5 \times 10^{-4}$ cm.$^2$ of silicon oxide deposition between coil turns.

Since $A_2$ is smaller than $A_1$ and to avoid solving the quadratic equation, the approximate value of $d_1$ can be obtained from $$d_1 = 0.08842 K \frac{A_1 + A_2}{C_1} = 41,000 \text{ Angstroms}$$

From the foregoing, the delay time per section is $$T_1 = 1.20 \text{ LC} = 1.049 \text{ ns.}$$

Thus, to provide a total delay time of 9 ns., the integral number of sections of the delay line is nine. As illustrated in FIG. 4, this is provided by arranging ten microminiature inductance coils 8 in two rows of five inductors each on a chip that is about one centimeter long and one-quarter centimeter wide.

From the foregoing it will be appreciated that the present invention provides a microminiature delay line which is of simplified construction for economical manufacture, suitable for hybrid circuit applications, and wherein the values of mutual inductance and capacitance per section may be varied as required by varying the physical dimensions of the components during manufacture.

It will be apparent to those skilled in the art that various changes may be made in the size, shape, type, number and arrangement of components described hereinbefore without departing from the spirit of this invention.

Having now described my invention and the manner in which it may be used, I claim:

1. A microminiature electrical delay line, comprising the solid, one-piece, integrated assembly of:
   (a) a first film of high permeability metal,
   (b) a first film of dielectric material overlying and bonded to the first film of high permeability metal,
   (c) a plurality of series-connected microminiature inductance coils overlying and bonded to the first film of dielectric material,
   (d) a second film of dielectric material overlying and bonded to the inductance coils, and
   (e) a second film of high permeability metal in the form of a narrow strip overlying and bonded to the second film of dielectric material and extending along the center line of the series-connected coils, the second film being interrupted at each coil to form a gap at the axis of ech coil.

2. The delay line of claim 1 including a substrate of dielectric material underlying and bonded to the first film of high permeability metal.

3. The delay line of claim 1 wherein the coils are spaced apart in a line, each coil has a central axis extending perpendicular to the plane of the substrate and has opposite end terminals extending in opposite directions from the coil on said line, and electrically conductive metal interconnects the confronting end terminals of adjacent coils.

4. The delay line of claim 2 wherein the substrate is quartz, the films of high permeability metal are permalloy and the films of dielectric material are silicon oxide.

* * * * *